US006987051B2

(12) United States Patent
Schwarzenbach et al.

(10) Patent No.: US 6,987,051 B2
(45) Date of Patent: Jan. 17, 2006

(54) METHOD OF MAKING CAVITIES IN A SEMICONDUCTOR WAFER

(75) Inventors: Walter Schwarzenbach, St. Nazaire les Eymes (FR); Christophe Maleville, La Terasse (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/733,729

(22) Filed: Dec. 12, 2003

(65) Prior Publication Data

US 2004/0180519 A1 Sep. 16, 2004

Related U.S. Application Data

(60) Provisional application No. 60/448,124, filed on Feb. 20, 2003.

(30) Foreign Application Priority Data

Dec. 20, 2002 (FR) .................................. 02 16049

(51) Int. Cl.
*H01L 21/331* (2006.01)

(52) U.S. Cl. ...................................... 438/311; 438/738

(58) Field of Classification Search ................ 438/311, 438/475, 738, 752, 753, 706, 756, 757
See application file for complete search history.

(56) References Cited

U.S. PATENT DOCUMENTS

| | | | | |
|---|---|---|---|---|
| 4,956,314 | A | 9/1990 | Tam et al. | 437/241 |
| 5,576,250 | A | 11/1996 | Diem et al. | 437/228 |
| 5,780,885 | A | 7/1998 | Diem et al. | 257/254 |
| 5,976,945 | A | 11/1999 | Chi et al. | 438/386 |
| 6,171,923 | B1 | 1/2001 | Chi et al. | 438/386 |
| 6,246,068 | B1 * | 6/2001 | Sato et al. | 257/3 |
| 6,294,478 | B1 * | 9/2001 | Sakaguchi et al. | 438/753 |
| 6,306,729 | B1 * | 10/2001 | Sakaguchi et al. | 438/458 |
| 6,335,292 | B1 | 1/2002 | Li et al. | 438/714 |
| 6,500,732 | B1 * | 12/2002 | Henley et al. | 438/459 |
| 6,534,382 | B1 * | 3/2003 | Sakaguchi et al. | 438/455 |
| 6,569,748 | B1 * | 5/2003 | Sakaguchi et al. | 438/455 |

FOREIGN PATENT DOCUMENTS

| | | |
|---|---|---|
| FR | 2 700 065 | 7/1994 |
| FR | 2 795 554 | 12/2000 |
| JP | 06132262 | 5/1994 |

* cited by examiner

*Primary Examiner*—David Nhu
(74) *Attorney, Agent, or Firm*—Winston & Strawn LLP

(57) ABSTRACT

The invention provides a method of making a semiconductor structure that includes a surface layer of silicon, a buried insulating layer, and a substrate. The method includes implanting atoms through at least a portion of the insulating layer; and etching the insulating layer in at least a portion of the layer through which atoms have been implanted.

26 Claims, 3 Drawing Sheets

METHOD OF MAKING CAVITIES IN A SEMICONDUCTOR WAFER

This application claims the benefit of U.S. provisional application 60/448,124 filed Feb. 20, 2003, the entire content of which is expressly incorporated herein by reference thereto.

TECHNICAL FIELD AND BACKGROUND

The invention relates to the field of making semiconductor components or elements, in particular on the basis of components or elements of the silicon on insulator (SOI) type.

A SOI structure comprises a layer of silicon having components properly formed therein, and beneath which is an insulator layer, for example of silicon dioxide, is buried. This layer provides insulation against parasitic currents and charges coming from ionized particles. It also provides good insulation from adjacent components made in the same layer of silicon, and in particular it provides a significant decrease in parasitic capacitances between such adjacent components. The insulating layer in turn rests on a substrate of silicon which acts as a mechanical support.

In certain cases or in certain applications, it is desirable to make one or more cavities in a silicon substrate or in a semiconductor material. The term “cavity” is used herein to mean an empty volume covered by or located within a layer of semiconductor material.

At present there is also a need for components or elements or structures that include such cavities. The present invention now satisfies this need.

SUMMARY OF THE INVENTION

The invention relates to a method of making a semiconductor structure having a surface layer of a first material, a sub-surface layer of a second, different material, and a supporting substrate. This method comprises selectively implanting atoms through the surface layer and at least a portion of the sub-surface layer to render the first and second materials receptive to removal by etching and then etching at least that portion of the sub-surface layer through which atoms have been implanted. If desired, the atoms may be implanted through the entire thickness of the sub-surface layer.

Advantageously, the second material is one that is more susceptible to etching than the first material, so that it can be removed more easily than the first material. The first material is preferably a semiconductor material and the second material has properties sufficient to electrically insulate the first material so that the subsurface layer is an insulating layer. A preferred first material of the surface layer is silicon and the preferred atoms to be implanted are ions of hydrogen or ions of helium.

The selective implantation of atoms can be obtained by masking a portion of the surface layer and implanting atoms in a zone that has a shape that corresponds with the non-masked portion of the surface layer. In this way, the masking can define an implantation zone of a predetermined shape, such as concave, convex or polygonal.

To remove the second material, at least one hole can be formed in the surface layer to a depth that leads to the sub-surface layer. This is used to direct the etchant to the sub-surface layer. The hole may lead to a boundary of the implantation zone and an adjacent zone through which atoms have not been implanted so that the implanted one as well as a portion of the non-implanted zone can be removed.

The invention also relates to a semiconductor structure comprising a surface layer of a first material; a sub-surface layer of a second material; a selected zone in both the surface layer and at least a portion of the sub-surface layer in which atoms have been implanted; and a substrate. The selected atom-implanted zone may have a concave, convex, or polygonal shape in a plane parallel to that of the sub-surface layer.

In one arrangement, the cavity has a shape that does not extend beyond or is essentially the same as that of the selected zone. However, at least a portion of the cavity can extend beyond the shape of the selected zone and into a portion of the sub-surface layer which is not implanted with atoms, if desired. This cavity may have a cylindrical, semi-cylindrical, square or rectangular shape, or be elliptical, partially elliptical, polygonal or partially polygonal.

Another embodiment relates to a semiconductor structure wherein the cavity includes a first zone having a first maximum dimension, and a second zone having a second maximum dimension, with the second maximum dimension being different from the first. The first and second zones of the cavity may be situated at the same or at different mean depths in the sub-surface layer.

BRIEF DESCRIPTION OF THE DRAWING FIGURES

Preferred features of the invention are now disclosed in the drawing figures, wherein.

DETAILED DESCRIPTION OF THE PREFERRED EMBODIMENTS

Figure 1:
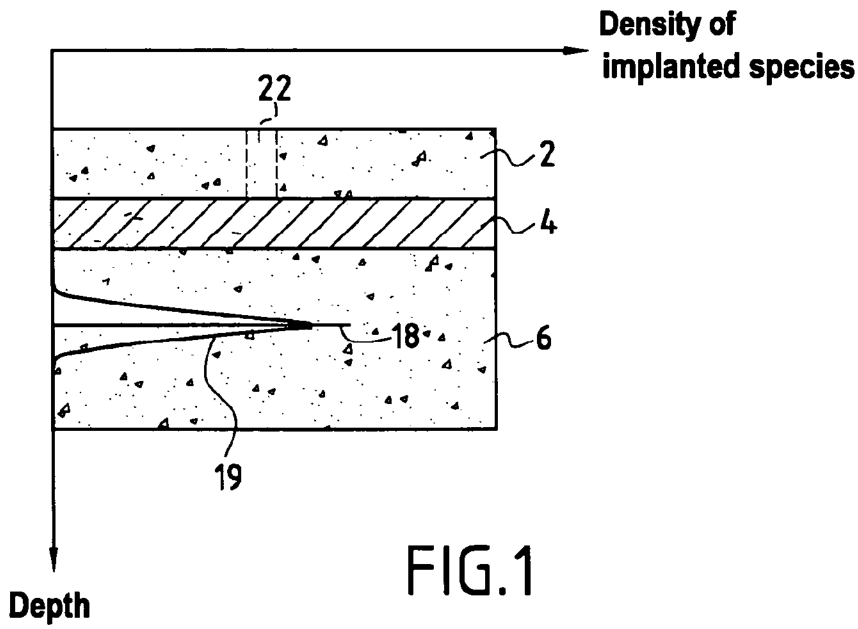
FIG. 1 shows an SOI substrate with ions implanted in the substrate.

In a first preferred aspect of the invention, the method of making a semiconductor structure comprises a step of implanting atoms through at least a portion of the insulating layer; and a step of etching the insulating layer in at least a portion of the layer through which atoms have been implanted. Such a structure can be made from an SOI structure. In the invention, the speed at which the insulator layer etches after atoms have been implanted through it is faster than the speed at which the insulator etches if atoms have not been implanted through it. Thus, the invention makes it possible to define zones or regions in the insulating layer with different etching speeds.

Atoms may be implanted through the entire thickness of the insulating layer, or through a portion only of said layer, thus forming a top portion of the insulating layer through which ions have passed, and a bottom portion of the insulation through which ions have not passed.

At least one hole may be formed in the silicon surface layer leading to the insulation layer, e.g., within a zone through which atoms have been implanted, or at the boundary between a zone through which atoms have been implanted and a zone through which atoms have not been implanted, or in a zone of concave shape, convex shape, or polygonal shape, through which atoms have been implanted.

By way of example, the insulating material may be selected from: silicon dioxide ($SiO_2$); silicon nitride ($Si_3N_4$); diamond; sapphire; hafnium oxide ($HfO_2$); zirconium oxide ($ZrO_2$); alumina ($Al_2O_3$); lanthanum oxide ($La_2O_3$); and ytterbium oxide ($Y_2O_3$).

The etching step is implemented using an acid, however it could equally well be implemented in the form of a dry or wet etching step.

The invention also preferably provides a semiconductor structure comprising, in a silicon substrate:

a surface layer of silicon;

a buried insulating layer of insulating material formed beneath the surface layer of silicon; and a zone in which atoms have been implanted in the insulating layer or beneath said insulating layer.

By way of layer, the zone in which atoms are implanted may be concave or convex or even polygonal in shape in a plane parallel to the mean plane of said buried insulating layer. Any other shape could be made.

The cavity may be formed in the insulating layer. For example, a portion at least of said cavity may be formed in a portion of the insulating layer through which the ions for implanting atoms have passed.

By way of example, the cavity may be cylindrical in shape, or semi-cylindrical. Other shapes may be implemented such as shapes of section that is at least partially elliptical, and/or at least partially polygonal in a plane parallel to the mean plane of the insulating layer.

In another aspect of the invention, the cavity has a first zone having a first diameter or with a first maximum or characteristic dimension, and a second zone having a second diameter or a second maximum or characteristic dimension, different from the first. These first and second zones may be situated at different mean depths in the insulating layer. These two zones may both be situated at the same depth in the insulating layer, or at mean depths in the insulating layer that are different.

FIG. 1 is a diagram of an SOI substrate in which atoms have been implanted.

Such an SOI structure comprises a silicon layer 2, preferably a single crystal or monocrystalline layer, in which components proper can be made, and beneath which there is formed a sub-layer or buried layer 4 of a material that provides insulation, e.g., silicon oxide.

This insulating layer 4 provides insulation against parasitic current and charge coming from ionized particles. It also provides good insulation between adjacent components made in the same layer of silicon 2, and in particular provides a significant decrease in parasitic capacitance between such adjacent components. In turn it rests on a substrate 6 of a semiconductor material, silicon, which acts as a mechanical support.

The silicon surface layer has a thickness lying in the range about 10 nanometers (nm) to 500 nm, or to 1000 nm, or to 3000 nm, while the thickness of the insulating layer is, for layer, of the order of a few hundreds of nm, for example lying in the range 100 nm or 200 nm to 400 nm or 500 nm.

These thicknesses, in particular the thickness of the insulating layer, may be varied.

In the invention, the substrate has atoms implanted therein from atomic or ionic species, preferably of hydrogen or helium such as $H^+$ or $H_2^+$ or $He^{2+}$, to a desired depth. The implanted ions form a layer or zone can extend into the insulating layer or even past and beneath the insulating layer, as desired. This implanting of atomic species gives rise to defects in the portion of the layer(s) through which the species have passed.

Thus, in FIG. 1, the plane 18 represents the mean plane in which ions have been implanted: all matter situated above this plane has had a flow of ions for implanting atoms pass therethrough. Curve 19, centered on this plane represents the mean distribution of ions in the substrate 6. In this example, the plane 18 is situated in the substrate 6, but it could equally well be situated in the layer 4, in which case only a portion of the insulation 4 would have had ions pass therethrough.

After implantation has taken place, the buried insulating layer can be etched, e.g., by means of an acid etchant such as hydrofluoric acid (HF) introduced via a hole 22 (shown in dashed lines in FIG. 1) leading to the insulating layer. Other etching methods may be used, with the same advantages, for example dry etching or wet etching using fluorine-containing compounds.

Figure 2A:
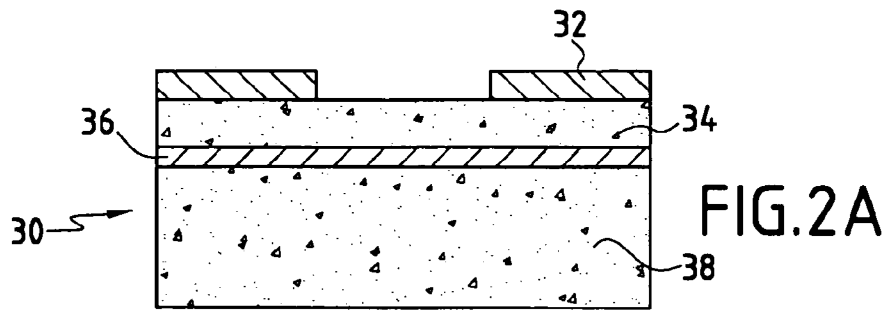
FIGS. 2A to 2C show different steps in a method of the invention.
Figure 2B:
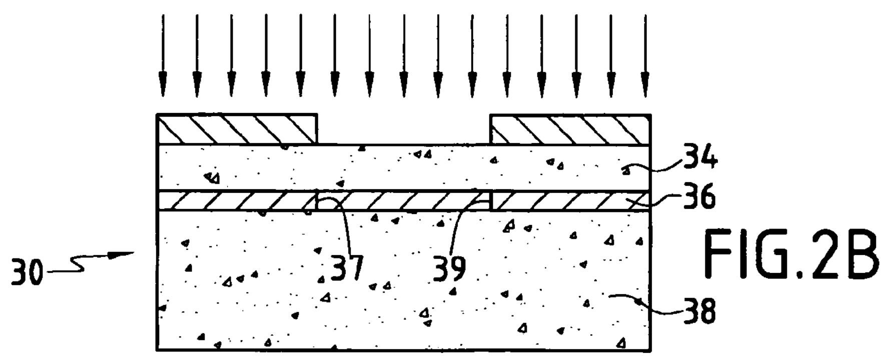
Figure 2C:
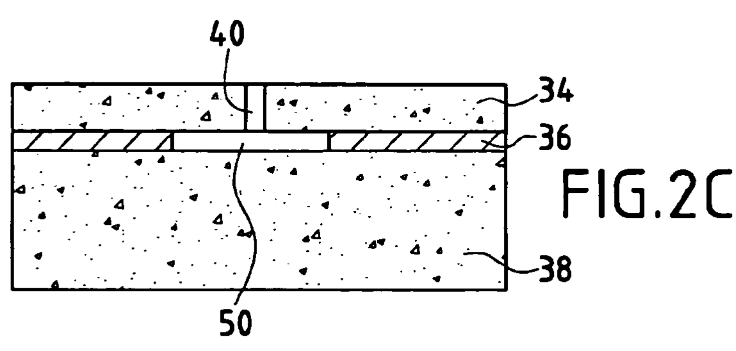

FIGS. 2A to 2C show various steps in a method of the invention. Starting from a wafer 30 of the SOI type, an implantation mask 32 is deposited to define the zone that is be implanted with atomic species (FIG. 2A). The depth of the insulation or of the buried oxide 36 defines the depth of the cavity that is eventually to be created. Reference 34 designates the surface layer of 5 silicon; reference 38 designates a supporting substrate.

Atomic species are implanted in the wafer through the opening in the mask (FIG. 2B), with the remainder of the mask protecting the SOI structure from these species. Implantation energy may be selected so as to create a high density of implanted species either in the insulating layer or buried oxide, or else at a depth measured from the surface of the surface layer of silicon 34 that is situated beyond the insulation or said buried oxide. The skilled artisan knows how to achieve the desired implantation depth by the appropriate selection of particle energy, so that feature need not be discussed in detail herein.

FIG. 2B illustrates that portion of the insulating layer 36 situated between limits 37 and 39 (corresponding to the edges of the window in the mask 32) that has been subjected to ions passing therethrough.

After the implantation mask has been removed, a hole 40 is made using etching techniques that are conventional in microelectronics so as to lead to the buried layer (FIG. 2C).

Finally, using HF, the insulation or buried oxide is etched selectively through said hole leading to the layer, in order to form the desired cavity 50. This cavity is readily formed because etching takes place much more quickly in the oxide material of the insulating layer, rather than in the surrounding semiconductor material. Furthermore, materials and layers that have been subjection to implantation or through which atomic species have passed are also etched more quickly than areas which have not been subject to implantation. This is illustrated in FIGS. 3A–3C.

Figure 3A:
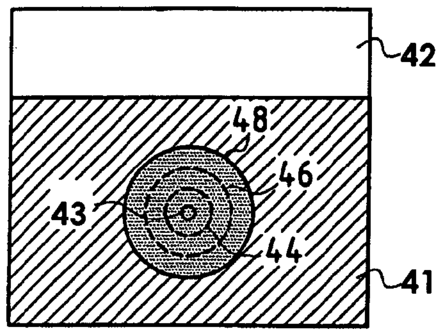
FIGS. 3A to 3C show different plan views of structures obtained using a method of the invention.

FIG. 3A is a plan view of an SOI substrate in which a method as described above has been implemented.

Figure 3B:
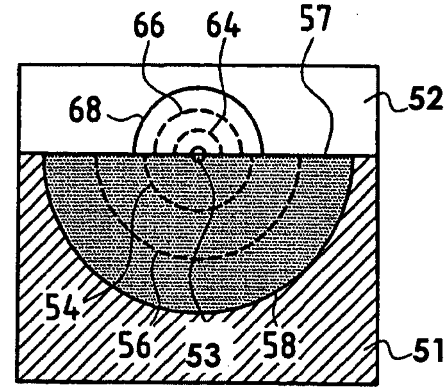
Figure 3C:
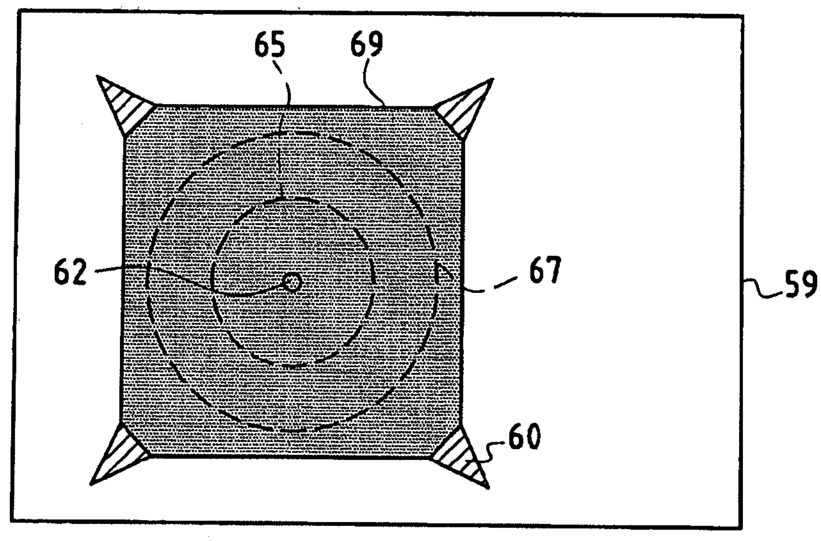

In this figure, as in FIGS. 3B and 3C, the zones that have been implanted and etched are shown gray, the zones that have been implanted but not etched are shaded, and the zones that have not been implanted are white.

Reference 41 designates the implanted zone of the substrate, the non-implanted zone being designated by reference 42. In this structure, the hole leading to the buried layer that has been made in the substrate is referenced 43 and is located in the core of the implanted zone 41.

Etching is performed progressively in the implanted zone and it takes place more quickly than in the non-implanted zone. For example, in FIG. 3A, reference 44 designates the cylinder or etched zone after a duration ΔT, reference 46 designates the etched zone after a duration 2ΔT, and the zone 48 is the zone that has been etched after a duration 3ΔT.

FIG. 3B illustrates hole 53 leading to the buried layer being made at the boundary 57 between the implanted zone 51 and the non-implanted zone 52, both zones being situated in the insulating layer of silicon dioxide. Etching then takes place simultaneously in both zones 51 and 52. Etching speeds in the two zones are nevertheless different from each other. That is why the etched zone 54 in the implanted zone 51 is, after duration AT, much larger than the corresponding zone 64 in the non-implanted region 52. Similarly, after a duration 2AT, the etched region 56 is larger than the etched region 66, and after a duration 3AT, the region 58 is larger than the region 68.

FIG. 3C illustrates hole 62 created in the center of an implanted zone of concave shape 60 situated in the zone 59 that is otherwise not implanted, thus making it possible to create a cavity 69 of square or substantially square shape. In this case, references 65,67, and 69 designate the cavities obtained after respective durations AT, 2AT, and 3AT.

Figure 4:
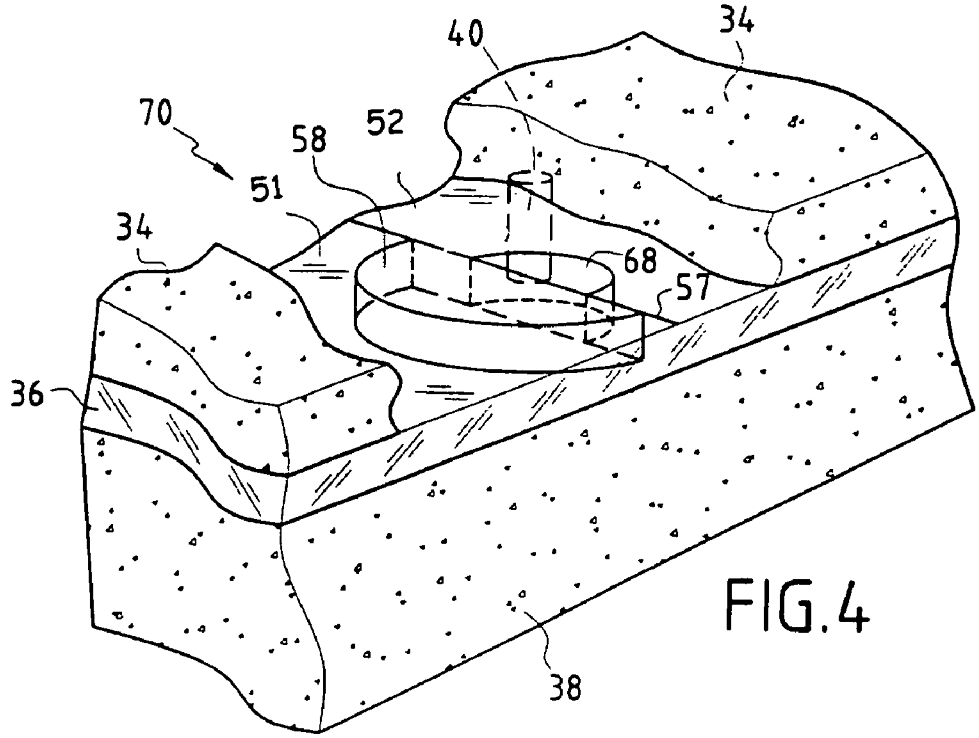
FIG. 4 is a perspective view of the structure shown in plan view in FIG. 3B.

FIG. 4 is a perspective view corresponding to the case shown in FIG. 3B; references 34, 36, 38 have the same meanings as in FIG. 2B. The two half-cylinders 58 and 68 pass through the layer of insulation 36 in a direction perpendicular to the plane of said layer and to the plane of the surface layer of silicon 34. FIG. 4 also illustrates in phantom the hole 40 that is used to direct etchant to the buried insulation layer, with this hole 40 placed on the boundary 57 between the implanted 51 and non-implanted 52 regions. For clarity, a portion of the surface layer has been omitted, it being understood that this portion would remain intact unless etched or otherwise removed.

Figure 5:
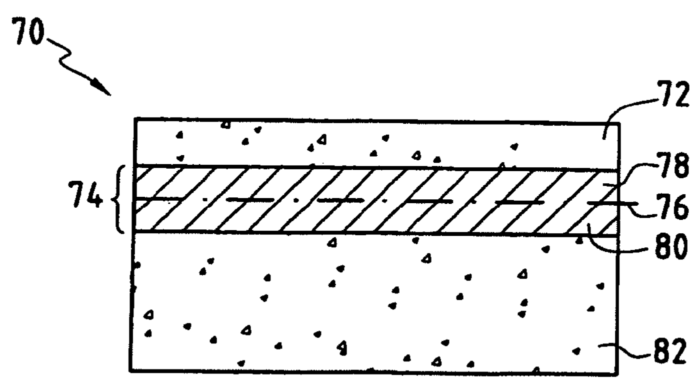
FIGS. 5 and 6 are a section view and a perspective view of a structure obtained using a method of the invention.

FIG. 5 shows an SOI structure 70 in which the surface layer of silicon 72 and the insulating or oxide layer 74 have been treated by a flux of ions only to a depth marked by plane 76 (the ion implantation zone or plane). In other words, the insulating or silicon dioxide layer is divided into a top portion 78 through 20 which the flux of ions has passed, and a portion 80 through which the flux of ions has not passed. The speed of etching is then different in these two zones, making it possible to realize etched patterns of section or diameter that varies along an axis perpendicular to the 25 plane 76 or to the plane of the layers 72 and 78. Reference 82 designates a supporting substrate.

Figure 6:
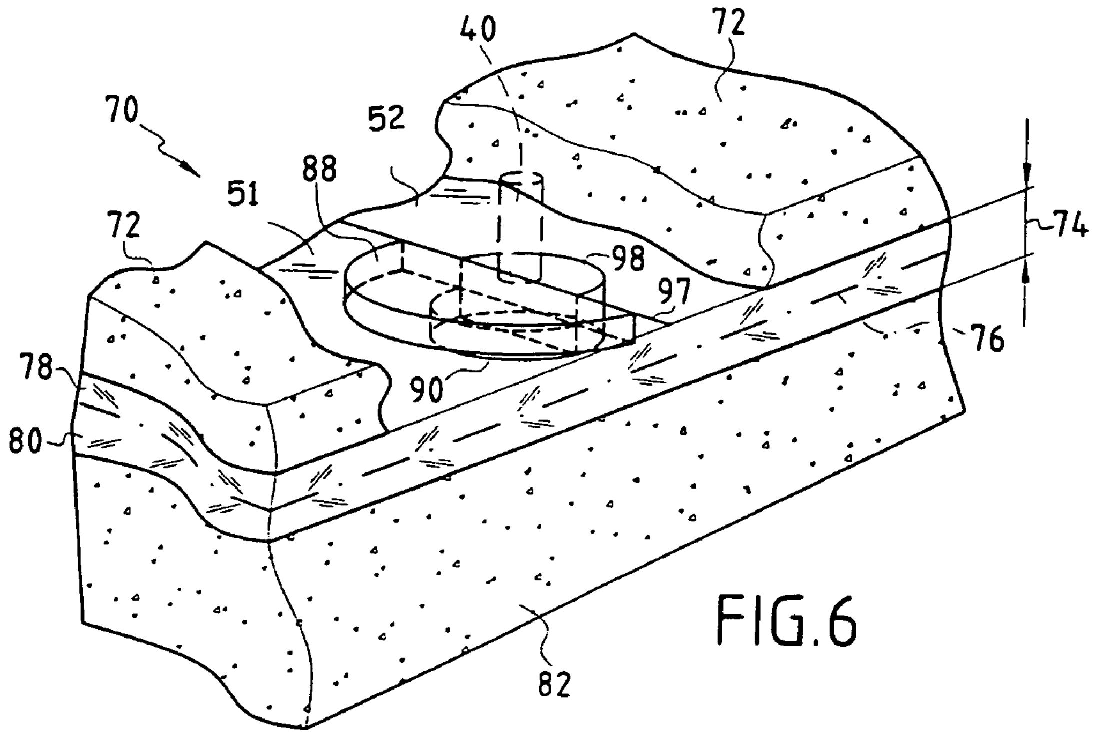

FIG. 6 is a perspective view showing the result of etching the insulating layer 74. As in FIG. 4, the hole for directing etchant is illustrated in phantom, with the hole 40 again being placed on the boundary 97 between the implanted 51 and non-implanted 52 portions. Again, part of the surface layer has been omitted for clarity in viewing the remaining portions of the structure.

In the implanted zone 78, the etched zone 88 is similar to the etched zone 58 in FIG. 4, however this occurs over a thickness that is smaller than the total thickness of the layer 36. Etching also takes place in the portion 80, but at a speed that is slower, thus giving rise to an etched zone 90 situated beneath the zone 88 i.e., at a mean depth that is deeper than the mean depth of the zone 88. In the plane of the layer 74, and beyond the boundary 97 between the implanted zone and the non-implanted zone, two portions of insulation situated at two distinct depths have also been etched (each facing a respective etched zone 88 or 90), however in these zones etching has taken place at the same speed since they are both in a non-implanted region. These zones therefore both have the same diameter or the same dimension and they constitute an etched zone 98.

It is thus possible to make etched zones situated at depths or at mean depths that are identical or different within the layer of insulation in an SOI structure, these depths being measured from the top of the insulating layer, i.e. where it makes contact with the surface layer 34, 72 of silicon, or else being measured from the top surface of the surface layer of silicon.

In another aspect, the invention makes it possible to define regions in an insulating layer such as the layer 4 of FIG. 1 in which the speeds of etching in said layer differ from one region to another. The insulating layer then presents at least a first region and a second region having respectively first and second etching speeds that are different from each other.

In an alternative embodiment, the point or location where etching begins may be situated in a zone that is not implanted, with etching subsequently propagating into a zone that has been implanted in which etching takes place at a speed that is different from the speed at which it takes place in the non-implanted zone.

Combining these various techniques mentioned above makes it possible to make etched zones having various sizes in two or three dimensions. Thus, in FIG. 6, the diameter or largest dimension or characteristic dimension in each portion or etched zone, or the section of said portion or etched zone, varies both in the plane of the layer 74 and in a direction perpendicular to the plane.

It is thus possible to make at least two etched zones in a layer of insulation in an SOI structure, which zones present a first diameter or a first maximum or characteristic dimension, a second diameter or second maximum dimension, different from the first diameter or the first maximum or characteristic dimension, and possibly situated at different depths in the insulating layer.

One and/or both of these zones may be square in section (as in FIG. 3C) or it may be cylindrical (FIG. 3A) or semi-cylindrical (FIG. 3B). Other shapes can also be made, depending on the shape of the mask initially selected for implantation purposes and on the point or location where etching is begun in the implanted region or outside it.

It is also possible to make a cavity of section that is elliptical or polygonal or partially elliptical and partially polygonal in a plane or mean plane parallel to the layer of insulation.

The zone in which atoms are implanted can be of any shape whatsoever, such as convex, concave, or any other shape. This shape of the zone in which atoms are implanted is associated with the final shape desired for the cavity. The shape can be obtained by selection of a mask of similar shape, which mask is applied to the surface of the article prior to implantation. For example, a concave zone can be obtained by the application of a mask that defines a concave open area.

Furthermore, placement of the etchant hole in the center of the shape will assist in minimizing of the etching of adjacent non-implanted areas. Also, a plurality of etchant introduction holes can be made and placed at selected sites within the shape to maximize removal of only the implanted insulation layer in the shape. As a simple example, consider a shape in the form of the number 8; an etchant hole can be placed in each of the top and bottom sections of shape so that etching of the shape is optimized.

Regardless of the invention involved, electronic components such as transistors for example can subsequently be made in the surface layer of silicon 2, 34, 72. The zone etched in the insulating layer serves, for example, to make a conducting portion for such a component. $SiO_2$ is typically used as the insulating material in an SOI structure.

Nevertheless, the invention also applies to other insulating materials, such as, for example: $Si_3N_4$, SiGe, diamond, or sapphire. It also applies to any material having a high coefficient K, such as those described in MRS Bulletin, March 2002, Vol. 27, No. 3, in an article entitled "Alternative gate dielectrics for microelectronics"; by way of example, such materials are hafnium oxide ($HfO_2$); zirconium oxide ($ZrO_2$); alumina ($Al_2O_3$); or indeed ytterbium oxide ($Y_2O_3$).

The invention also applies to sublayers that are made of other materials. Such materials are those that are more susceptible to etching than the surface layer. In particular, those materials that become more susceptible to etching after implantation of atoms or ions are preferred, since the implantation is easily carried out by masking the surface layer to provide a shape or boundary that defines the more easily etched material. Of course, the skilled artisan can select the desired materials based on the intended final size or configuration of the cavity or the desired structure of the semiconductor device.

What is claimed is:

1. A method of making a semiconductor structure having a surface layer of a first material, a sub-surface layer of a second, different material, and a supporting substrate, which method comprises:

selectively implanting atoms through the surface layer and at least a portion of the sub-surface layer to render the first and second materials receptive to removal by etching; and selectively etching the portion of the sub-surface layer through which atoms have been implanted in order to form a cavity beneath the surface layer.

2. The method according to claim 1, which further comprises providing the second material to be one that is more susceptible to etching than the first material so that it is more easily removed than the first material.

3. The method according to claim 1, wherein the first material is a semiconductor material and the second material has properties sufficient to electrically insulate the first material so that the sub-surface layer is an insulating layer.

4. The method according to claim 3, in which the first material of the surface layer is silicon and the atoms to be implanted are ions of hydrogen or ions of helium.

5. The method according to claim 1, wherein the atoms are implanted through an entire thickness of the sub-surface layer.

6. A method of making a semiconductor structure having a surface layer of a first material, a sub-surface layer of a second, different material, and a supporting substrate, which method comprises:

selectively implanting atoms through the surface layer and at least a portion of the sub-surface layer to render the first and second materials receptive to removal by etching, wherein the selective implantation of atoms is obtained by masking a portion of the surface layer and implanting atoms in a zone that has a shape that corresponds with a non-masked portion of the surface layer; and selectively etching the portion of the sub-surface layer through which atoms have been implanted in order to form a cavity beneath the sub-surface layer.

7. The method according to claim 6, wherein the masking is applied to define an implantation zone of a predetermined shape.

8. The method according to claim 7, wherein the predetermined shape of the implantation zone is concave or convex.

9. The method according to claim 7, wherein the predetermined shape of the implantation zone is polygonal.

10. A method of making a semiconductor structure having a surface layer of a first material, a sub-surface layer of a second, different material, and a supporting substrate, which method comprises:

selectively implanting atoms through the surface layer and at least a portion of the sub-surface layer to render the first and second materials receptive to removal by etching;

forming at least one hole in the surface layer to a depth that leads to the sub-surface layer; and selectively etching the portion of the sub-surface layer through which atoms have been implanted in order to form a cavity beneath the surface layer.

11. The method according to claim 10, wherein the hole leads to a boundary of the implantation zone and an adjacent zone through which atoms have not been implanted.

12. The method according to claim 1, wherein the etching is performed with an acid.

13. The method according to claim 1, wherein the etching is performed wet or dry.

14. The method according to claim 10, wherein the second material is silicon dioxide (SiO2); silicon nitride (Si3N4); diamond; sapphire; hafnium oxide (HfO2); zirconium oxide (ZrO2); alumina (Al2O3); lanthanum oxide (La2O3); or ytterbium oxide (Y2O3).

15. The method of claim 1 wherein the implanted portion of the subsurface layer is etched with a wet or dry etchant.

16. The method of claim 15 which further comprises processing the surface layer to provide access for the etchant to the implanted portion of the subsurface layer.

17. The method of claim 16 wherein access is provided by at least one hole extending through the surface layer to the subsurface layer.

18. The method of claim 1 which further comprises defining an implantation zone of a pre-determined concave, convex, or polygonal shape.

19. The method according to claim 1, wherein the second material is silicon dioxide (SiO2); silicon nitride (Si3N4); diamond; sapphire; hafnium oxide (HfO2); zirconium oxide (ZrO2); alumina (Al2O3); lanthanum oxide (La2O3); or ytterbium oxide (Y2O3).

20. The method according to claim 6, wherein the second material is silicon dioxide (SiO2); silicon nitride (Si3N4); diamond; sapphire; hafnium oxide (HfO2); zirconium oxide (ZrO2); alumina (Al2O3); lanthanum oxide (La2O3); or ytterbium oxide (Y2O3).

21. The method of claim 6 wherein the implanted portion of the subsurface layer is etched with a wet or dry etchant.

22. The method of claim 21 which further comprises processing the surface layer to provide access for the etchant to the implanted portion of the subsurface layer.

23. The method of claim 22 wherein access is provided by at least one hole extending through the surface layer to the subsurface layer.

24. The method of claim 6 wherein the first material is a semiconductor material and the second material has properties sufficient to electrically insulate the first material so that the sub-surface layer is an insulating layer, and wherein the atoms are implanted through an entire thickness of the sub-surface layer.

25. The method of claim 10 which further comprises defining an implantation zone of a pre-determined concave, convex, or polygonal shape.

26. The method of claim 10 wherein the implanted portion of the subsurface layer is etched with a wet or dry etchant.

* * * * *

UNITED STATES PATENT AND TRADEMARK OFFICE

CERTIFICATE OF CORRECTION

PATENT NO. : 6,987,051 B2 Page 1 of 1
DATED : January 17, 2006
INVENTOR(S) : Schwarzenbach et al.

It is certified that error appears in the above-identified patent and that said Letters Patent is hereby corrected as shown below:

Title page,
Item [75], Inventors, change the city of residence of inventor "Maleville" from "Terasse" to -- Terrasse --.
Item [30], Foreign Application Priority Data, change "02 16049" to -- 02 16409 --.

Column 5,
Line 12, after "duration", delete "AT" and insert -- ΔT --.
Line 14, after "duration", delete "2AT" and insert -- 2ΔT --.
Line 15, after "duration", delete "3AT" and insert -- 3ΔT --.
Line 23, after "durations", delete "AT, 2AT, and 3AT" and insert -- ΔT, 2ΔT, and 3ΔT --.

Signed and Sealed this

Twenty-eighth Day of March, 2006

JON W. DUDAS
*Director of the United States Patent and Trademark Office*